United States Patent
Lee et al.

(10) Patent No.: US 10,068,895 B2
(45) Date of Patent: Sep. 4, 2018

(54) TRANSISTORS PATTERNED WITH ELECTROSTATIC DISCHARGE PROTECTION AND METHODS OF FABRICATION

(71) Applicant: GLOBALFOUNDRIES Inc., Grand Cayman (KY)

(72) Inventors: Chien-Hsin Lee, Malta, NY (US); Xiangxiang Lu, Woodlands (SG); Manjunatha Prabhu, Malta, NY (US); Mahadeva Iyer Natarajan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 31 days.

(21) Appl. No.: 14/661,202

(22) Filed: Mar. 18, 2015

(65) Prior Publication Data

US 2016/0276336 A1    Sep. 22, 2016

(51) Int. Cl.
*H01L 23/62* (2006.01)
*H01L 27/02* (2006.01)
*H01L 29/417* (2006.01)

(52) U.S. Cl.
CPC ........ *H01L 27/0266* (2013.01); *H01L 27/027* (2013.01); *H01L 29/41775* (2013.01)

(58) Field of Classification Search
CPC ..... H01L 23/62; H01L 23/60; H01L 27/0266; H01L 27/0248; H01L 29/41758
See application file for complete search history.

(56) References Cited

U.S. PATENT DOCUMENTS

| 4,462,041 | A | * | 7/1984 | Glenn | ................ | H01L 29/0692 |
| | | | | | | 257/401 |
| 6,097,066 | A | * | 8/2000 | Lee | ..................... | H01L 27/0251 |
| | | | | | | 257/355 |
| 7,141,831 | B1 | * | 11/2006 | Vashchenko | ........ | H01L 27/0262 |
| | | | | | | 257/124 |
| 8,018,000 | B2 | | 9/2011 | Chen et al. | | |
| 2016/0268800 | A1 | * | 9/2016 | Kushner | ............. | H01L 27/0266 |

* cited by examiner

*Primary Examiner* — Michael Lebentritt
*Assistant Examiner* — Suberr Chi
(74) *Attorney, Agent, or Firm* — Heslin Rothenberg Farley & Mesiti P.C.; Nathan Brian Davis

(57) ABSTRACT

High-voltage semiconductor devices with electrostatic discharge (ESD) protection and methods of fabrication are provided. The semiconductor devices include a plurality of transistors on a substrate patterned with one or more common gates extending across a portion of the substrate, and a plurality of first S/D contacts and a plurality of second S/D contacts associated with the common gate(s). The second S/D contacts are disposed over a plurality of carrier-doped regions within the substrate. One or more floating nodes are disposed above the substrate and, at least in part, between second S/D contacts to facilitate defining the plurality of carrier-doped regions within the substrate. For instance, the carrier-doped regions may be defined from a mask with a common carrier-region opening, with the floating node(s) intersecting the common carrier-region opening and facilitating defining, along with the common opening, the plurality of separate carrier-doped regions.

12 Claims, 3 Drawing Sheets

TRANSISTORS PATTERNED WITH ELECTROSTATIC DISCHARGE PROTECTION AND METHODS OF FABRICATION

FIELD OF THE INVENTION

The present invention relates in general to semiconductor devices, and more particularly, to semiconductor devices with transistors patterned with enhanced electrostatic discharge protection, such as for high-voltage applications, and to methods of fabrication thereof.

BACKGROUND OF THE INVENTION

Damage to semiconductor devices from electrostatic discharge (ESD) can occur at any point, from manufacture to field service. An electrostatic discharge is defined as a transfer of charge between bodies at different electrical potentials. When subject to high discharge voltages, many semiconductor devices can suffer permanent effects. For instance, an electrostatic discharge event may cause a catastrophic failure or a latent defect in a device. A catastrophic failure occurs when the semiconductor device no longer functions after the electrostatic discharge event, while a latent defect is more difficult to identify. In the case of a latent defect, the semiconductor device may be partially degraded due to the electrostatic discharge event, but still continue to perform its intended function. The degradation, however, may reduce the operating life of the device, potentially resulting in costly future repair or replacement operations.

Various external solutions and procedures have been developed for preventing or reducing electrostatic discharge damage during device fabrication. Manufacturers often implement electrostatic-protective areas (EPAs), with international standards existing that define a typical EPA. For instance, EPA standards are provided by the International Electrochemical Commission (IEC), and by the American National Standards Institute (ANSI).

In addition to external electrostatic discharge prevention mechanisms, semiconductor devices may also incorporate electrostatic discharge protection internally into the design or layout of the device. For instance, various methods and configurations for adding an $N^+$ or $P^+$ doped region have been implemented in field-effect transistor (FET) devices in association with the source/drain (S/D) or gate regions. Additional enhancements to these internal electrostatic discharge protection designs are desired to provide electrostatic discharge protection for, for instance, high-voltage applications, at low fabrication cost.

BRIEF SUMMARY

Various shortcomings of the prior art are overcome, and additional advantages are provided through the provision, in one aspect, of a semiconductor device which includes a plurality of transistors on a substrate. The plurality of transistors include, for instance: at least one common gate; a plurality of first S/D contacts associated with the at least one common gate; a plurality of second S/D contacts associated with the at least one common gate and corresponding ones of the plurality of first S/D contacts, the plurality of second S/D contacts being disposed over a plurality of carrier-doped regions within the substrate, and the plurality of second S/D contacts, the corresponding ones of the plurality of first S/D contacts and the at least one common gate defining, in part, the plurality of transistors; and at least one floating node disposed, at least in part, between second S/D contacts of the plurality of second S/D contacts, the at least one floating node facilitating defining the plurality of carrier-doped regions within the substrate.

In another aspect, a method of fabricating a plurality of transistors is provided. The method includes: providing at least one common gate above a substrate and a plurality of first S/D contacts associated with the at least one common gate; providing a plurality of floating nodes disposed above the substrate and, at least in part, intersecting a common carrier-region opening in an implant mask to overlie the substrate, the plurality of floating nodes facilitating defining, along with the common carrier-region opening, a plurality of carrier-doped regions within the substrate; and providing a plurality of second S/D contacts associated with the at least one common gate and corresponding ones of the plurality of first S/D contacts, the plurality of second S/D contacts being disposed over the plurality of carrier-doped regions, and the plurality of second S/D contacts, the corresponding first S/D contacts and the at least one common gate defining, in part, the plurality of transistors.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc, are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note that reference is made below to the drawings, which are not drawn to scale for ease of understanding, wherein the same reference numbers used throughout different figures designate the same or similar components.

Disclosed herein are semiconductor devices, such as high-voltage semiconductor devices, or power semiconductor devices, and methods of fabricating such devices. The semiconductor devices include a plurality of transistors or transistor groups patterned with enhanced electrostatic discharge protection of the semiconductor device. By way of example, high-voltage (HV) metal oxide semiconductor field-effect transistor (MOSFET) based devices are disclosed which readily pass industry-specified electrostatic discharge specifications. By way of example, a high-voltage semiconductor device may be a device with an application voltage of 10 volts or greater.

By way of example, power semiconductor devices may occupy a significant portion of a power management chip. One approach typically employed to increase a semiconductor device's electrostatic discharge capability is to increase the drain dimension. For instance, by adding silicide block additional drain width of 0.8 microns, enhanced ESD capability may be obtained. However, this approach may be prohibitive in a power semiconductor device, since it will increase the resultant chip size significantly. For instance, in a typical device pitch today, source contact to drain contact spacing in a 20V diffused metal-oxide-semiconductor (DMOS) is approximately 2.5 microns, and adding 0.8 micron silicide block drains would increase the device size by approximately 25%. In addition, even if designed with a larger rule, the electrostatic discharge device often cannot protect the power semiconductor device, since it turns on after the power semiconductor device.

Figure 1:
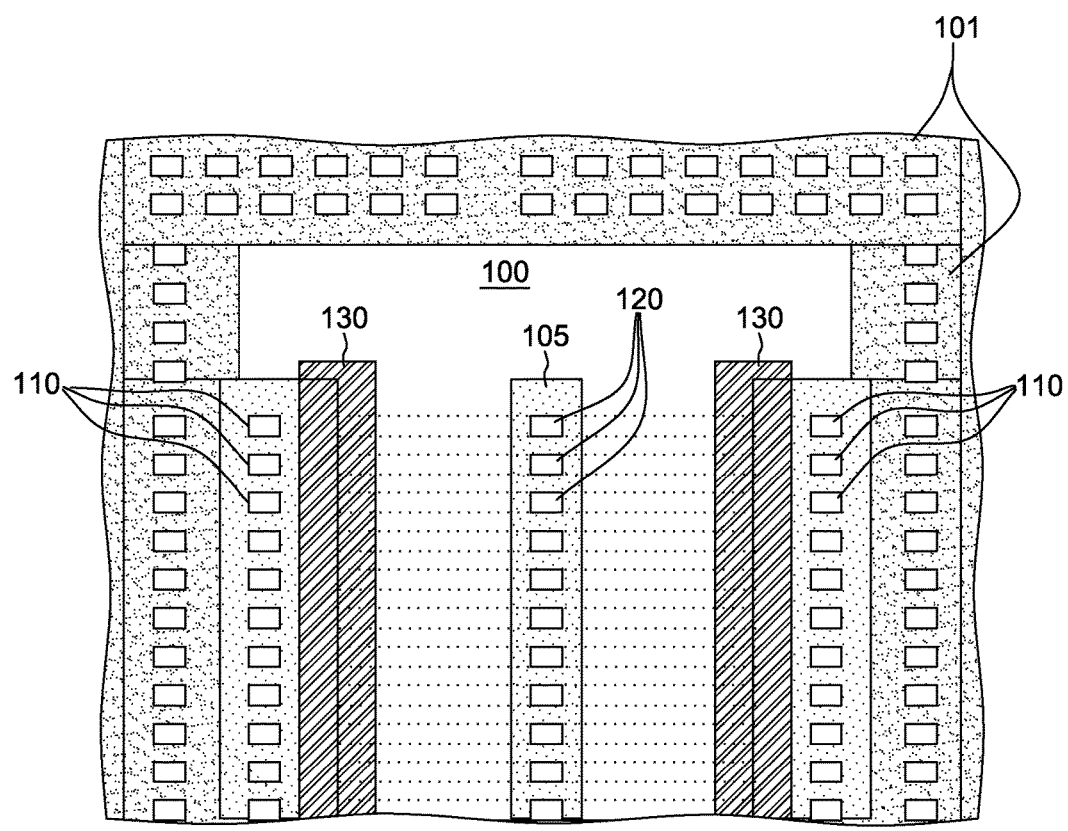
FIG. 1 is a plan view of one embodiment of a transistor group with a common $N^+$ S/D implant region, to be modified in accordance with one or more aspects of the present invention.

FIG. 1 depicts one possible solution, wherein a transistor group 100 is provided within a guard ring 101. As shown, transistor group 100 includes a common N$^+$ doped region 105 within the substrate, as well as first and second S/D contacts 110 & 120, respectively, and common gate regions 130. Note that as used herein, S/D contacts refers to source/drain contacts, wherein first S/D contacts 110 may be source contacts, and second S/D contacts drain contacts, or first S/D contacts 110 may be drain contacts, and second S/D contacts source contacts, dependent on the particular implementation. Electrostatic discharge protection is provided to transistor group 100 by having N$^+$ doped region 105 at the second S/D contacts 120. As illustrated, this carrier-doped (e.g., implanted/diffused) region 105 underlies and surrounds the second S/D contacts 120, thereby reducing breakdown that otherwise occurs during a high-voltage operation. One disadvantage of the common doped region approach, and similar configurations known in the art, is that they do not typically provide good and qualified electrostatic discharge protection for high-voltage applications. For instance, while the common N$^+$ doped region 105 of the embodiment of FIG. 1 reduces breakdown that occurs during a high-voltage operation, lateral and other breakdown current leakage associated with an electrostatic discharge event may continue to be experienced within transistor group 100.

Figure 2A:
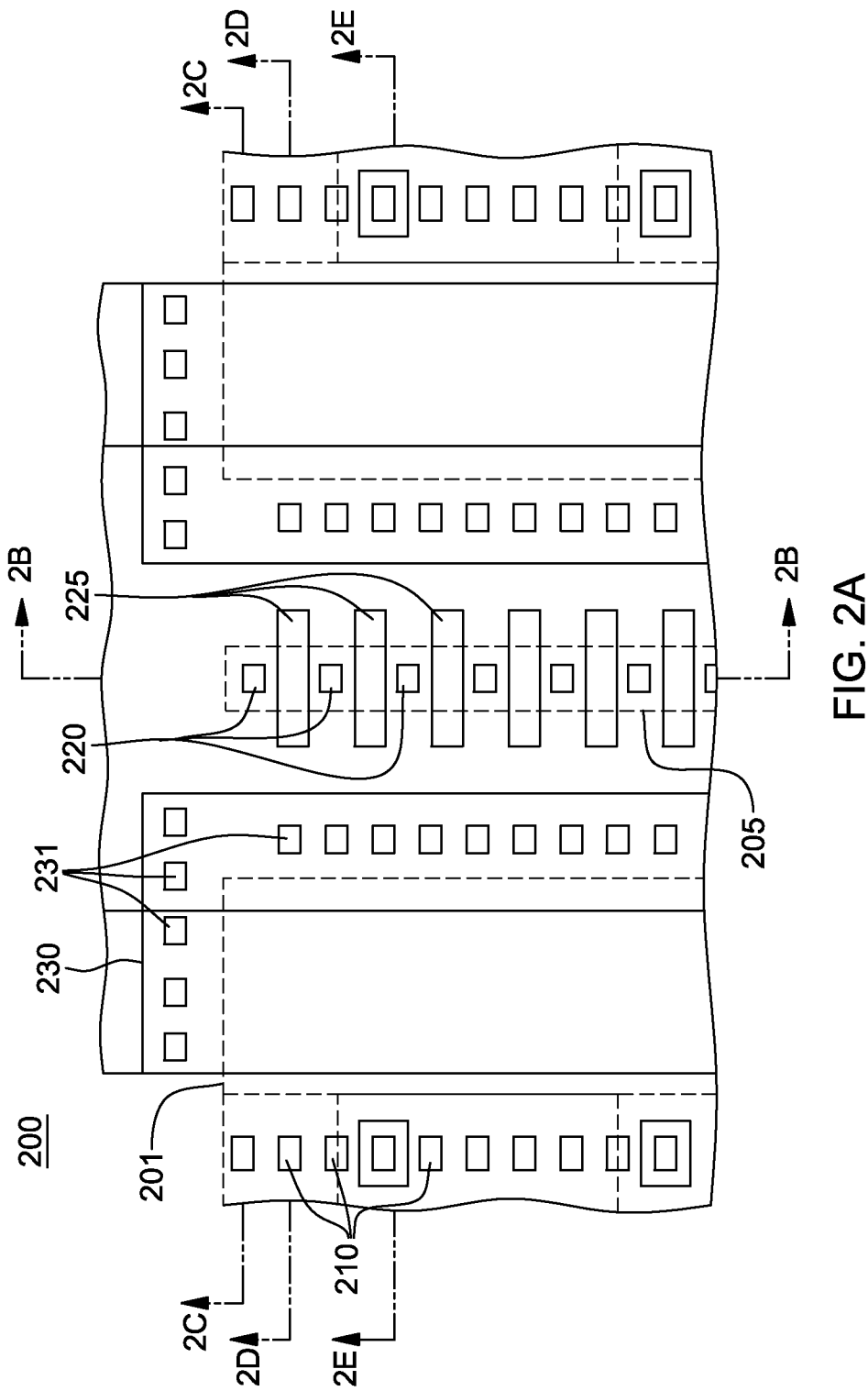
FIG. 2A is a plan view of one embodiment of a transistor group of a semiconductor device, the transistor group being patterned in accordance with one or more aspects of the present invention.

FIG. 2A is a plan view of another approach, where a transistor group 200 of a semiconductor device is shown, configured or patterned in accordance with one or more aspects of the present invention. As illustrated, transistor group 200 includes a plurality of first S/D contacts 210 and a plurality of second S/D contacts 220 with, in one example, the plurality of first S/D contacts 210 being a plurality of source contacts, and the plurality of second S/D contacts 220 being a plurality of drain contacts of an N-type transistor group. One or more common gate regions 230 are provided extending across a portion of the underlying substrate within and above which transistor group 200 resides. A plurality of gate contacts 231 are provided to common gate regions 230. As explained further below, outside of active (or COMP) semiconductor regions 201, 205, isolation barriers are provided within the substrate, for instance, via field oxide or shallow trench isolation. In one implementation, the gate contacts 231, including associated gate terminals, reside over isolation areas of the transistor group 200, that is, outside active regions 201, 205. Further, in one or more implementations, the COMP regions are the active regions, and may be defined in a P-well or N-well. With an N$^+$ implant or a P$^+$ implant to one or more such regions, an N$^+$ junction or a P$^+$ junction may be formed. Also, those skilled in the art will note that various embodiments of the present invention may be used with different substrates or semiconductor materials, such as silicon, gallium arsenide, germanium, and the like. The embodiments disclosed herein are not limited to any particular type of semiconductor material in the underlying substrate.

Figure 2B:
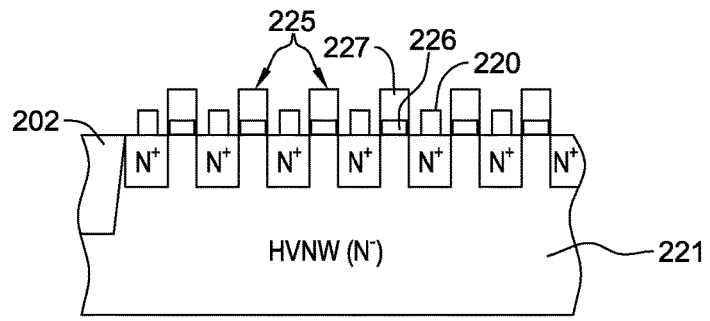
FIG. 2B is a partial cross-sectional elevational view of the transistor group of FIG. 2A, taken along line 2B-2B thereof, in accordance with one or more aspects of the present invention.

Referring to FIG. 2B, a first cross-sectional elevational view of transistor group 200 is depicted, taken along line 2B-2B of FIG. 2A. As noted, in the depicted implementation, N-type transistors are employed, with an N$^-$ High-Voltage N-Well (HVNW) 221 being defined, and a plurality of carrier-doped regions 222 defined, each separated from the other by the semiconductor material of the substrate, or more particularly, by regions of HVNW 221. The plurality of carrier-doped regions 222 may be, in one embodiment, a plurality of N$^+$ doped regions, and the second plurality of S/D contacts 220 overly, or lie within, and couple to HVNW 221 via respective N$^+$ doped region. Note that by way of example, an N$^+$ doped region might refer to a region with a dopant concentration of $1E^{20}/cm^3$ or greater, and an N$^-$ region to a region with a dopant concentration below this level, depending, for instance, on device breakdown voltage. For a high-voltage application, the N$^-$ region may be a region with a dopant concentration below $1E^{18}/cm^3$.

In accordance with one or more aspects of the present invention, one or more floating nodes (or floating gates) 225 are provided to facilitate separate implanting of the plurality of carrier-doped regions 222 from an implant mask with a common carrier-region opening, such as might be used to defined carrier-doped region 105 in the embodiment of FIG. 1. For instance, the plurality of carrier-doped regions 222 may be formed from a common carrier-region opening in the implant mask, by providing a plurality of floating nodes 225, as illustrated in FIGS. 2A & 2B, overlying, at least in part, where the common carrier-doped region would otherwise be formed in the substrate by the implant, separating the common carrier-region opening of the mask into the plurality of carrier-doped regions 222. In one or more implementations, the floating nodes 225 include, for instance, polysilicon or a metal. For example, in one embodiment, the plurality of floating nodes 225 may be formed contemporaneous with forming of common gate regions 230, and each may include the same layers as the common gate regions, such as an oxide layer 226 and an overlying polysilicon layer 227. The presence of the plurality of floating nodes 225 extending across the common carrier-region opening advantageously separates or isolates carriers into the plurality of separate carrier-doped regions 222, which are self-aligned to the floating nodes 225. As illustrated, the plurality of floating nodes 225, in one or more embodiments, are interleaved with the plurality of second S/D contacts 220. Note that once the floating nodes are provided, the plurality of carrier-doped regions 222 may be formed using conventional implant and diffusion processes used to obtain the structure of FIG. 1, except that, the desired doped islands are obtained at each second S/D contact 220. In high-voltage implementations, the separation of the plurality of carrier-doped regions 222 advantageously greatly reduces the amount of current leakage within transistor group 200.

By way of example, electrostatic discharge current in an embodiment such as depicted in FIG. 1 would be from the respective contact(s) through the common $N^+$ implant, the drain junction, the P-well to the grounded source, and the $P^+$ diffusion (or guard ring). In such a configuration, the common $N^+$ can conduct a greater amount of current than the drain junction can handle, potentially resulting in junction damage. Using a design such as depicted in FIGS. 2A & 2B having a plurality of floating nodes, the $N^+$ implant region becomes multiple small $N^+$ implants, and every small $N^+$ implant has only one contact associated with it. These small $N^+$ implants are similar to a fuse, which function to limit the current, and prevent a high current flow through the drain junction. Thus, the device depicted in FIGS. 2A & 2B can sustain a greater high-voltage electrostatic discharge stress than that of FIG. 1.

In the implementation depicted, the junction between the $N^+$ doping of the carrier-doped regions 222, and the lighter doping ($N^-$) of the surrounding HVNW 221 in the substrate provides a higher barrier to current flow than would the continuous $N^+$ doping of the continuous or common doped region 105 illustrated in FIG. 1. By thus limiting the current through the second S/D contacts 220 with underlying separated $N^+$ carrier-doped regions 222, the current that passes through second S/D contacts 220 is much more uniform. This uniformity prevents the passing of a very high current that would normally be present during an ESD event. Moreover, because the current that passes through first S/D contacts 210 is related to the current that passes through second S/D contacts 220, this current limiting at the second S/D contacts protects the transistors from being damaged by an excessive current that conventionally accompanies an ESD event.

Figure 2C:
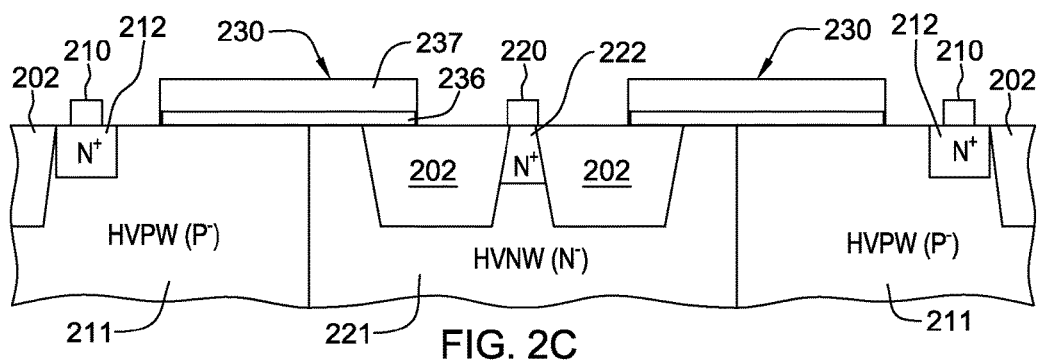
FIG. 2C is a partial cross-sectional elevational view of the transistor group of FIG. 2A, taken along line 2C-2C thereof, in accordance with one or more aspects of the present invention.

Referring to FIG. 2C, a cross-sectional elevational view through transistor group 200 of FIG. 2A is taken along line 2C-2C thereof. In this view, the cross-section is taken through one second S/D contact 220 disposed above a respective carrier-doped region 222 within HVNW 221. As illustrated, isolation areas 202 are provided on opposite sides of the carrier-doped region 222 formed within HVNW 221. In one embodiment, these isolation areas may be shallow trench isolation regions of the transistor group.

As depicted in FIG. 2C, in one or more implementations, a majority of first S/D contacts 210 overlie respective carrier-doped regions 212 within, for instance, an underlying, High-Voltage P-Well (HVPW) 211 (or P-base). In an N-type transistor group implementation such as depicted, carrier-doped regions 212 are respective $N^+$ doped regions within HVPWs 211 beneath respective first S/D contacts. In one or more implementations, HVPW regions 211 may be, for instance, P-based regions formed within HVNW 221, as understood by one skilled in the art. As shown, common gates 230 may be formed of an oxide layer 236, with a polysilicon layer 237 overlying oxide layer 236, similar to the above-described floating nodes. Note that, as used herein, various types of oxides may be employed, such as silicon oxide, silicon dioxide, silicon nitride, and the like. The present invention is not limited to the particular type of oxide used in the common gate regions 230, or the floating nodes 225.

Figure 2D:
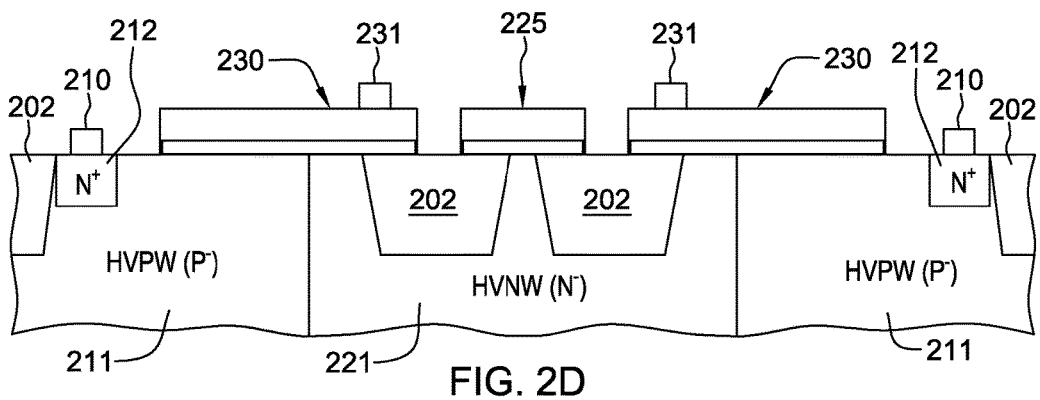
FIG. 2D is a partial cross-sectional elevational view of the transistor group of FIG. 2A, taken along line 2D-2D thereof, in accordance with one or more aspects of the present invention.

FIG. 2D is a similar cross-section to that of FIG. 2C, but with the cross-section being taken through a floating node 225, rather than a second S/D contact 220, as in the case of FIG. 2C. In particular, FIG. 2D is taken along line 2D-2D of FIG. 2A, and as illustrated, the floating node 225 over HVNW 221 blocks the adjacent carrier-doped regions 222 of FIG. 2C from extending below floating node 225, thus functioning to separate or isolate adjacent carrier-doped regions of the plurality of carrier-doped regions 222 of FIGS. 2A & 2B. Note also with reference to FIG. 2D, that semiconductor material, and in particular, HVNW 221 in the example depicted, fills the space below floating node 225 and between the adjacent carrier-doped regions 222 of FIGS. 2B & 2D.

Figure 2E:
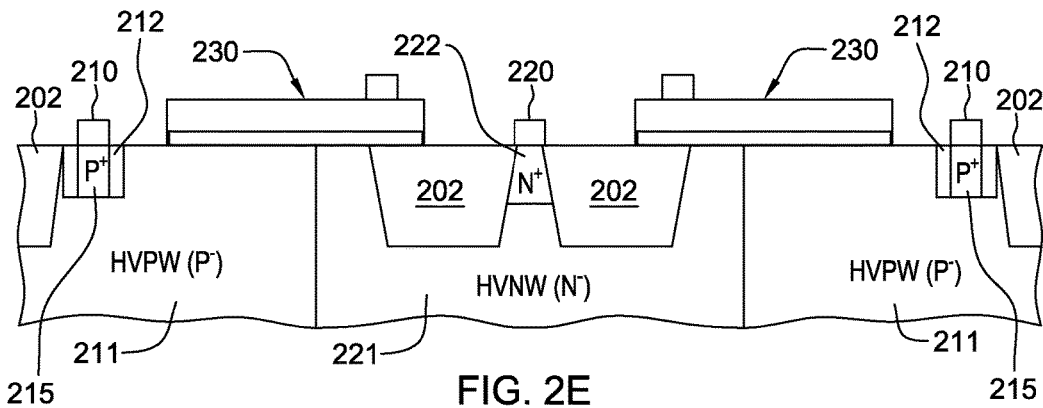
FIG. 2E is a partial cross-sectional elevational view of the transistor group of FIG. 2A, taken along line 2E-2E thereof, in accordance with one or more aspects of the present invention.

FIG. 2E is a cross-sectional depiction of transistor group 200 of FIG. 2A, taken along line 2E-2E thereof, and is similar to the cross-sectional view of FIG. 2C, with the exception that FIG. 2E is taken through selectively modified, well-doped regions 215 beneath selected first S/D contacts 210 and, for instance, within the respective carrier-doped regions 212. In accordance with one or more aspects of the present invention, multiple such well-doped regions 215 may be defined below selected first S/D contacts 210. In one or more implementations, well-doped regions 215 may be $P^+$ regions within HVPW 211 and, for instance, within $N^+$ doped regions 212. The result is that the respective first S/D contacts 210 are electrically grounded to HVPW 211, which essentially merges the traditional body contacts to the HVPW with the first S/D contacts. Thus, during an ESD event, current that passes through those particular first S/D contacts 210 over well-doped regions 215 will effectively be grounded in the HVPW 211, thus further protecting transistor group 200 during the ESD event. Note that the particular placement of the well-doped regions 215 may be varied, with the distance between the well-doped regions determining, in one or more implementations, the well resistance.

Providing well-doped regions 215 within carrier-doped regions 212 advantageously reduces source dimensions, and increases well resistance to make the associated parasitic NPN bipolar turn on easily. In one or more implementations, a high-voltage device may include multi-finger devices. In a conventional high-voltage device, each source contact may be disposed over a $P^+$ diffusion, while in a configuration such as depicted in FIGS. 2A & 2E, the $P^+$ region of the high-voltage device may be within the source region. As a result, the source region of the new high-voltage device disclosed herein may be much smaller than that of a conventional high-voltage device. Because there are $N^+$ regions between adjacent small $P^+$ diffusions, a resistor (R) is formed between the well contacts. For a conventional high-voltage device, there is little or no resistance, since the $P^+$ implant is a long common strip. During an electrostatic discharge event, the high-voltage device will use its parasitic NPN bipolar to discharge the electrostatic discharge charges. The bipolar turn on condition is that the PN diode between the source (N⁺) and the HVPW is formed (≥0.7 V). This is caused by the current flowing through the HVPW resistor (R) to pull up the potential of the HVPW ($I_{PW} \times R$). Without R (that is, R=0), a conventional high-voltage device is difficult to satisfy this condition ($I_{PW} \times R \geq 0.7$ V). So in a conventional device, it can only use biasing at the breakdown region to induce high Joule-heating ($V_{BK} \times I_{ESD} \times$time) due to the high breakdown voltage ($V_{BK}$). Subsequently, the high Joule-heating may lead to thermal runaway within the device. With a resistance such as described herein, the bipolar of the new high-voltage device can be turned on, since it can satisfy the turn on condition ($I_{PW} \times R \geq 0.7$ V). As the bipolar turns on, the ESD voltage can be clamped at the low voltage ($V_{SP}$). The $V_{SP}$ is much smaller than the breakdown voltage $V_{BK}$, resulting in less Joule-heating ($V_{SP} \times I_{ESD} \times$time). Where $I_{ESD}$ is approximately $V_{ESD}/15$ K'Ω, and time for the ESD is nearly 150 nanoseconds. If the $V_{SP}$ is smaller, it needs higher ESD zapping voltage to generate the same Joule-heating to damage the device, and thus, the transistor group layout disclosed herein can sustain higher ESD zapping voltages.

Advantageously, those skilled in the art will note that, disclosed herein are semiconductor devices which include enhanced transistor groups patterned to, for instance, provide internal ESD protection to the devices, such as high-voltage MOSFET-based devices. In one or more implementations, the transistor groups disclosed may be employed in association with the power pins of a semiconductor chip. An ESD handling improvement for, for instance, a power transistor is provided, which only requires, in one or more implementations, two mask layers to be revised or retrofitted, such as the polysilicon layer and the contact layer. The concepts disclosed herein do not change transistor current-voltage characteristics, and can improve device electrostatic discharge passing voltage significantly, for instance, from 0.3 kV-1.5 kV. Advantageously, no specific process alternations or add-ons are required in order to implement the concepts disclosed. The transistor groups disclosed may work well with various technology nodes including, for instance, 0.18 micron and 0.13 micron high-voltage technologies and products. Further, although disclosed herein with reference to N-type transistors, the transistor group disclosed can be readily converted by one skilled in the art for P-type transistors as well, if desired.

Generally stated, those skilled in the art will note from the above description that provided herein are semiconductor devices and methods of fabrication thereof. The semiconductor device includes, for instance, a plurality of transistors on a substrate. The plurality of transistors include: at least one common gate; a plurality of first S/D contacts associated with the at least one common gate; a plurality of second S/D contacts associated with the at least one common gate and corresponding ones of the plurality of first S/D contacts, the plurality of second S/D contacts being disposed over a plurality of carrier-doped regions within the substrate, and the plurality of second S/D contacts, the corresponding first S/D contacts and the at least one common gate defining, at least in part, the plurality of transistors; and at least one floating node disposed, at least in part, between second S/D contacts of the plurality of second S/D contacts, where the at least one floating node facilitates defining the plurality of carrier-doped regions within the substrate during an implanting thereof.

In one or more implementations, the floating node(s) includes at least one floating polysilicon region disposed above the substrate and, at least in part, between second S/D contacts of the plurality of S/D contacts. The substrate may include a semiconductor material, and the semiconductor material may be disposed between adjacent carrier-doped regions of the plurality of carrier-doped regions, and beneath the floating node(s). In one or more embodiments, the plurality of carrier-doped regions may be defined from an implant mask with a common carrier-region opening over the substrate, with the floating node(s) intersecting, at least in part, the common carrier-region opening and facilitating defining, along with the common carrier-region opening, the plurality of carrier-doped regions within the substrate. In certain embodiments, the plurality of transistors may include a plurality of floating nodes, the at least one floating node being at least one floating node of the plurality of floating nodes, and the floating nodes are disposed above the substrate and, at least in part, between respective second S/D contacts of the plurality of second S/D contacts. By way of example, in certain implementations, second S/D contacts of the plurality of second S/D contacts may be aligned, at least in part, and floating nodes of the plurality of floating nodes may be interleaved with the aligned, second S/D contacts such that the second S/D contacts and floating nodes alternate over the substrate.

In certain embodiments, the plurality of first S/D contacts may include a plurality of source contacts, and the plurality of second S/D contacts may include a plurality of drain contacts, where the plurality of carrier-doped regions within the substrate are a plurality of doped drain regions within the substrate over which the plurality of drain contacts are disposed, and wherein the at least one floating node facilitates separating the plurality of carrier-doped regions within the substrate. In one or more implementations, the plurality of transistors may further include a plurality of doped source regions within the substrate, and at least one well-doped region within the substrate, the plurality of doped source regions within the substrate being disposed beneath the plurality of source contacts, and the at least one well-doped region is doped to electrically ground a respective overlying first S/D contact(s) of the plurality of first S/D contacts to a well region of the plurality of transistors.

In one or more implementations, the plurality of transistors may further include multiple well-doped regions within the substrate, where the multiple well-doped regions within the substrate are disposed beneath respective first S/D contacts of the plurality of first S/D contacts, the multiple well-doped regions being doped to electrically ground the respective overlying first S/D contact(s) to a well region of the plurality of transistors within the substrate.

In one or more implementations, the substrate is a high-voltage substrate, and the common gate region(s) includes a gate terminal in contact for each of the plurality of transistors. Further, the first S/D contacts provide an individual first S/D terminal for each of the plurality of transistors, and the plurality of second S/D contacts provide an individual second S/D terminal for each of the plurality of transistors. By way of example, in an N-type transistor implementation, the first S/D contacts include source contacts, and the second S/D contacts are drain contacts.

As noted, both the common gate(s) and the floating node(s) may be formed at the same time, using the same process steps. For instance, each may be formed of an oxide layer with a polysilicon layer disposed over the oxide layer. The floating node(s) is patterned to accomplish the separating function disclosed herein, terminating, for instance, over respective isolation areas of the transistor group and, in one or more implementations, may be formed as thin strips of floating nodes disposed between adjacent second S/D contacts. The resultant transmitter group configuration or pattern advantageously directs current flow in an ESD event to remain between respective source and drains of the transistors, which limits the possibility of overloading and damage to the transistor group.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A semiconductor device comprising:
   a plurality of transistors on a substrate, the plurality of transistors comprising:
   at least one common gate;
   a plurality of first source/drain (S/D) contacts associated with the at least one common gate;
   a plurality of second S/D contacts associated with the at least one common gate and corresponding ones of the plurality of first S/D contacts, the plurality of second S/D contacts being disposed over a plurality of carrier-doped regions within the substrate, and the plurality of second S/D contacts, the corresponding first S/D contacts and the at least one common gate defining, in part, the plurality of transistors; and
   a plurality of floating nodes disposed above the substrate and between respective second S/D contacts of the plurality of second S/D contacts and not between the plurality of first S/D contacts, the plurality of floating nodes facilitating defining the plurality of carrier-doped regions within the substrate, and wherein the plurality of floating nodes are isolated laterally above the substrate from one another.

2. The semiconductor device of claim 1, wherein the plurality of floating nodes comprise at least one floating polysilicon region disposed above the substrate and, at least in part, between second S/D contacts of the plurality of second S/D contacts.

3. The semiconductor device of claim 1, wherein the substrate comprises a semiconductor material, the semiconductor material being disposed between adjacent carrier-doped regions of the plurality of carrier-doped regions, and beneath the plurality of floating nodes.

4. The semiconductor device of claim 1, wherein the plurality of carrier-doped regions are defined from an implant mask within a common carrier-region opening over the substrate, at least one floating node of the plurality of floating nodes intersecting, at least in part, the common carrier-region opening, and facilitating defining, along with the common carrier-region opening, the plurality of carrier-doped regions within the substrate, the plurality of carrier-doped regions being self-aligned to the at least one floating node.

5. The semiconductor device of claim 1, wherein the plurality of carrier-doped regions are defined from an implant mask with a common carrier-region opening over the substrate, the plurality of floating nodes intersecting, at least in part, the common carrier-region opening, and facilitating defining, along with the common carrier-region opening, the plurality of carrier-doped regions within the substrate, the plurality of carrier-doped regions being self-aligned to the plurality of floating nodes.

6. The semiconductor device of claim 1, wherein second S/D contacts of the plurality of second S/D contacts are aligned with one another, at least in part, and floating nodes of the plurality of floating nodes are interleaved with the aligned second S/D contacts.

7. The semiconductor device of claim 1, wherein the plurality of first S/D contacts comprise a plurality of source contacts, and the plurality of second S/D contacts comprise a plurality of drain contacts, and wherein the plurality of carrier-doped regions within the substrate comprise a plurality of doped drain regions within the substrate over which the plurality of drain contacts are disposed, the plurality of floating nodes facilitating separating the plurality of doped drain regions within the substrate.

8. The semiconductor device of claim 7, wherein the plurality of transistors further comprise a plurality of doped source regions within the substrate, and at least one well-doped region within the substrate, the plurality of doped source regions within the substrate being disposed beneath the plurality of source contacts, and the at least one well-doped region being doped to electrically ground a respective overlying at least one first S/D contact of the plurality of first S/D contacts to a well region of the plurality of transistors.

9. The semiconductor device of claim 1, wherein the plurality of transistors further comprise multiple well-doped regions within the substrate, the multiple well-doped regions within the substrate being disposed beneath respective first S/D contacts of the plurality of first S/D contacts, and the multiple well-doped regions being doped to electrically ground the respective overlying first S/D contacts of the plurality of first S/D contacts to a well region of the plurality of transistors within the substrate.

10. The semiconductor device of claim 9, wherein the plurality of carrier-doped regions are defined from an implant mask with a common carrier-region opening over the substrate, at least one floating node of the plurality of floating nodes intersecting, at least in part, the common carrier-region opening, and facilitating defining, along with the common carrier-region opening, the plurality of carrier-doped regions within the substrate, the plurality of carrier-doped regions being self-aligned to the at least one floating node.

11. The semiconductor device of claim 1, wherein the substrate comprises a high-voltage substrate.

12. The semiconductor device of claim 1, wherein the at least one common gate and the plurality of floating nodes each comprise an oxide layer with a polysilicon layer disposed above the oxide layer.

* * * * *